United States Patent
Finzi

(10) Patent No.: US 6,329,691 B1
(45) Date of Patent: Dec. 11, 2001

(54) DEVICE FOR PROTECTION OF SENSITIVE GATE DIELECTRICS OF ADVANCED NON-VOLATILE MEMORY DEVICES FROM DAMAGE DUE TO PLASMA CHARGING

(75) Inventor: David G. A. Finzi, Migdal Haemek (IL)

(73) Assignee: Tower Semiconductor Ltd., Migdal Haemek (IL)

(*) Notice: Subject to any disclaimer, the term of this patent is extended or adjusted under 35 U.S.C. 154(b) by 0 days.

(21) Appl. No.: 09/460,277

(22) Filed: Dec. 13, 1999

(51) Int. Cl.[7] .......................... H01L 29/76; H01L 29/94; H01L 31/113
(52) U.S. Cl. .......................... 257/355; 257/402; 257/363
(58) Field of Search .......................... 257/402, 355, 257/363

(56) References Cited

U.S. PATENT DOCUMENTS

| | | |
|---|---|---|
| 5,768,192 | 6/1998 | Eitan . |
| 5,953,249 * | 9/1999 | van der Wagt . |
| 6,054,740 * | 4/2000 | Barret . |
| 6,121,665 * | 9/2000 | Gonzalez et al. . |

* cited by examiner

Primary Examiner—Stephen D. Meier
(74) Attorney, Agent, or Firm—John M. Kubodera; E. Eric Hoffman; Bever, Hoffman & Harms, LLP

(57) ABSTRACT

A protective circuit includes a pair of diodes to protect the gate dielectric of an insulated-gate semiconductor device from over-voltage conditions, such as can occur during plasma etch manufacturing processes. The diodes are either anode- or cathode-coupled, and are connected between the gate of the device and bulk ground. Because of their opposing polarities, one of the diodes is always reverse-biased regardless of whether a positive or negative control voltage is applied to the gate of the device. As a result, the protective circuit imposes no operational restrictions on normal control voltages. At the same time, the circuit limits any plasma-induced charge buildup that can arise during manufacturing. If the gate voltage rises, a first of the two diodes is reverse biased and prevents the protective circuit from conducting. When the gate voltage reaches the reverse breakdown voltage of the first diode (plus the small forward voltage drop of the second diode), both diodes begin to conduct. Any subsequent charge accumulation at the gate is drained off by the protective circuit. Similarly, if the magnitude of a negative gate voltage reaches the reverse breakdown voltage of the second diode (plus the small forward drop of the first diode), both diodes again begin to conduct, and no further negative charge accumulation is permitted. Therefore, the protective circuit limits the voltage potential that can develop across the gate dielectric of the device.

18 Claims, 4 Drawing Sheets

*conventional diode-based protection scheme*

*multi-diode protection scheme*

*multi-diode protection scheme*

DEVICE FOR PROTECTION OF SENSITIVE GATE DIELECTRICS OF ADVANCED NON-VOLATILE MEMORY DEVICES FROM DAMAGE DUE TO PLASMA CHARGING

BACKGROUND OF THE INVENTION

1. Field of the Invention

The present invention relates to insulated-gate semiconductor devices. More specifically, the present invention relates to a circuit for limiting the maximum voltage applied across the gate dielectric of a semiconductor device.

2. Discussion of Related Art

To produce the fine geometries of modern semiconductor devices, anisotropic dry etching techniques are indispensable. In a typical dry etch (or "plasma etch") process, an electric field is used to energize an etchant gas into a plasma state. The energized species within the plasma are then directed towards a patterned wafer to perform the etching function. Without this process, sub-2 µm geometries would be extremely difficult, if not impossible, to produce.

At the same time, the shrinking dimensions of modern semiconductor devices makes such devices more susceptible to damage from stray charge buildup or voltage transients. An insulated-gate, or metal-oxide-semiconductor (MOS) device, such as a transistor or a non-volatile memory (NVM) cell, typically incorporates a very thin gate dielectric layer to improve device performance and reduce power consumption. Unfortunately, radiation effects during plasma etch process steps can threaten the integrity of that thin dielectric layer. The highly energized species created by the plasma can cause a substantial amount of charge to accumulate on metal lines (interconnects) connected to the gate of the MOS device. This charge buildup then produces a large voltage potential across the gate dielectric. A voltage in excess of a limit voltage (specific to the particular device) can render the MOS device unusable by physically degrading the gate dielectric, or by causing electrons to tunnel into the gate dielectric and shift the device threshold voltage.

To guard against these damaging effects, a diode is typically connected in parallel with any sensitive gates. The diode is intended to limit the maximum voltage that can build up across the gate dielectric, while not interfering with normal operating voltages.

FIG. 1 depicts a conventional protective scheme, showing a planar diode 120 coupled to a MOS device 110 in an integrated circuit (IC) (not shown). Device 110 comprises an n+ region drain 116 and an n+ region source 118, both of which are formed in a p-type substrate 190. MOS device 110 further comprises a control gate 112 and a gate dielectric 114. Gate dielectric 114 can comprise various layers depending on the application of MOS device 110. For example, a NVM cell might include a gate dielectric comprising a "stack" of oxide and nitride layers, whereas a standard MOS transistor would have just a single oxide layer. Regardless of its particular structure, however, gate dielectric 114 would require protection from excessive charge buildup at control gate 112.

Diode 120 performs that protective function for gate dielectric 114. Diode 120 comprises an n+ region 122 formed in a p-well 124. The resulting p-n junction provides the protective diode action of circuit 120, with n+ region 122 serving as a cathode and p-well 124 serving as an anode. N+ region 122 is connected to gate 112 of MOS device 110 by an interconnect 102. Because substrate 190 serves as a "bulk ground" (common ground) for all devices in the IC, diode 120 is effectively coupled in parallel with gate dielectric 114 of MOS device 110.

FIG. 2 shows a circuit electrically equivalent to the structure in FIG. 1. FIG. 2 shows a diode 220 cathode-coupled to the gate (control) terminal of a MOS device 210 in an integrated circuit (IC) (not shown). The anode of diode 220 and the body terminal of MOS device 210 are both coupled to bulk ground of the IC. The power terminals of MOS device 210 are coupled to various other devices (not shown) within the IC.

The gate terminal of MOS device 210 is coupled to receive an input (control) voltage Vin. During normal operation of the IC, voltage Vin switches between several predetermined control voltages. Those control voltages are sized so as not cause any damage to MOS device 210. However, prior to actual use, the gate terminal of MOS device 210 is typically "floating", i.e., not coupled to any voltage source. Therefore, during manufacturing, voltage Vin is not regulated, and the magnitude of voltage Vin is determined by whatever charge accumulates on interconnects coupled to the gate terminal of MOS device 210. This type of "induced" voltage Vin can have a magnitude far in excess of normal control voltages. This is especially true during plasma etch processes, which can generate an effective voltage Vin of more than 15V. This is much higher than the damage threshold of most modern semiconductor devices. For example, a typical non-volatile memory (NVM) cell, such as described in U.S. Pat. No. 5,768,192, has a gate dielectric thickness of less than 200A. As the voltage across the gate dielectric of such a device rises above 12.5V, charge can start to tunnel into the dielectric. This in turn can shift the threshold voltage of the device and render it unusable.

Diode 220 protects MOS device 210 from any potentially damaging positive gate voltages. When charge buildup raises voltage Vin to the reverse breakdown voltage Vb of diode 220, diode 220 goes into reverse conduction, draining away any additional charge. Diode 220 sets an upper limit on input voltage Vin, ensuring that the actual gate voltage seen by MOS device 210 can never rise above voltage Vb. At the same time, normal positive control voltages are not affected by diode 220. When a positive control voltage is applied to the gate terminal of MOS device 210, diode 220 is reverse biased and does not conduct. Therefore, proper protective function is achieved by sizing diode 220 such that its reverse breakdown voltage Vb is: a) greater than any control voltage to be applied to the gate terminal of MOS device 210; and b) below a "limit voltage" at which the gate dielectric of MOS device 210 would begin to be affected.

However, many modern devices require that input voltage Vin vary between both positive and negative voltages; for instance to program and erase certain types of NVM cells. In such cases, the conventional single-diode scheme shown in FIG. 2 is problematic. When voltage Vin is negative, diode 220 goes into forward conduction, shunting the gate and body terminals of MOS device 210. The magnitude of the gate voltage seen by MOS device 210 is then limited to the forward voltage drop Vf of diode 220. Typically, the forward voltage drop of a diode is quite small. The negative voltage at the gate terminal of MOS device 210 is therefore prevented from reaching the level required for proper device operation.

For example, assume MOS device 210 is coupled to receive input voltages Vin of +9V and −9V during normal operation, and that any gate voltage over +12.5V would damage the gate dielectric of MOS device 210. Also, assume that plasma etch steps during the manufacturing process can generate input voltages of up to +15V. Finally, assume diode 220 has a forward voltage drop Vf of 0.6V and a reverse breakdown voltage Vb of 11.5V, typical values for a planar diode formed in a semiconductor substrate. During manufacturing, diode 220 limits the gate voltage of MOS device 210 to a "safe" +11.5V, even if charge buildup on the gate tries to pull the voltage to +15V. During normal operation, when input voltage Vin is at +9V, diode 220 is reversed biased, so the gate voltage is unaffected at +9 v. However, when input voltage Vin swings to −9V, diode 220 is forward biased and begins to conduct. The actual gate voltage seen by MOS device 210 is only −0.6V, not enough to properly operate transistor 210. As a result, the conventional single-diode protection circuit shown in FIG. 2 is inappropriate for devices requiring negative control voltages during normal operation. The results are summarized in Table 1.

TABLE 1

Conventional Protective Scheme Results

| Status | Vin | Desired Gate Voltage | Actual Gate Voltage |
| --- | --- | --- | --- |
| Plasma Etch | +15V | <+12.5V | +11.5V |
| IC Operation: Positive Input | +9V | +9V | +9V |
| IC Operation: Negative Input | −9V | −9V | −0.6V |

Accordingly, it is desirable to provide a protection circuit for a MOS device that prevents gate dielectric damage without affecting normal operation of the device, even if the device is coupled to receive both positive and negative control voltages.

SUMMARY

The present invention is directed towards apparatus and methods for protecting insulated-gate semiconductor devices, such as MOS transistors and NVM cells, from damage due to excessive gate voltages, such as those induced during plasma etch manufacturing process steps. The present invention avoids the operational restrictions imposed by conventional single-diode protection schemes by utilizing a multiple diode string to prevent both damage from radiation-induced overcharging and operational errors due to unintended shunting.

In one embodiment of the present invention, the protective circuit includes a first diode and a second diode connected in series between the gate and body terminals of the MOS device to be protected. The diodes are coupled in either an anode-to-anode or cathode-to-cathode configuration. The diodes are sized such that a) the magnitudes of their reverse breakdown voltages are greater than the magnitudes of the normal operating control voltages for the MOS device; and b) the magnitudes of their reverse breakdown voltages are less than the voltage that would begin to damage the gate dielectric of the MOS device.

Thus, during normal operation of the MOS device, the protective circuit has no effect on the operation of the MOS device. Regardless of whether the control voltage applied to the gate of the MOS device is positive or negative, one of the diodes will be reverse-biased. Since the operating control voltages are less than the reverse breakdown voltages of the diodes, the protective circuit remains non-conducting.

At the same time, the protective circuit prevents charge buildup generated by plasma etch process steps from damaging the gate dielectric of the MOS device. For example, assume that whenever a positive voltage potential develops at the gate of the MOS device during the manufacturing process, the first diode is reverse biased. Then, when the gate voltage exceeds an upper safety voltage equal to the reverse breakdown voltage of the first diode plus the forward voltage drop of the second diode, both diodes start to conduct. The protective circuit therefore drains off any further positive charge accumulation that would tend to increase the gate voltage. Correspondingly, when a negative voltage develops at the gate, the second diode is reverse biased. If the gate voltage drops below a lower safety voltage equal to the negative of the forward voltage drop of the first diode and the reverse breakdown voltage of the second diode, the protective circuit drains off any further negative charge accumulation. Therefore, the gate voltage is constrained to fall between the lower safety voltage and the upper safety voltage. The magnitude of the upper and lower safety voltages are such that the voltage potential across the gate dielectric is maintained below the level at which degradation would begin to occur.

In one embodiment of the present invention, the diodes of the protective circuit are manufactured as discrete planar diodes, connected by an interconnect. In another embodiment of the present invention, a doped region of one of the diodes extends into a doped region of the other diode, eliminating the need for the interconnect.

The present invention will be more fully understood in view of the following description and drawings.

DETAILED DESCRIPTION

Figure 3:
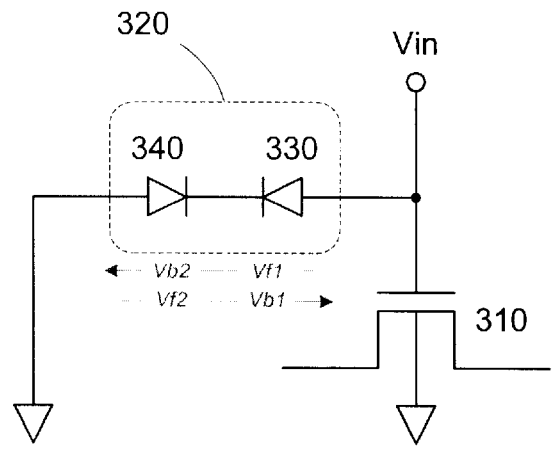
FIG. 3 is a schematic diagram illustrating a multi-diode protective circuit coupled to a MOS device.

FIG. 3 shows a schematic diagram of a circuit comprising a multi-diode protection circuit 320 in accordance with an embodiment of the present invention. Circuit 320 comprises cathode-coupled diodes 330 and 340, and is coupled to protect a MOS device 310 in an IC (not shown). The anode of diode 330 is connected to the control (gate) terminal of MOS device 310, while the anode of diode 340 is connected to bulk ground of the IC. The power terminals of MOS device 310 are coupled to various other devices (not shown) in the IC.

The gate terminal of MOS device 310 is coupled to receive an input voltage Vin. During normal operation of the IC, voltage Vin switches among several predefined control voltages. However, during manufacturing, the amount of charge that builds up on interconnects (not shown) coupled to the control terminal of MOS device 310 determines the magnitude of voltage Vin. As described previously, the voltages generated by this process-related charge buildup can be significantly higher than the predefined control voltages expected during normal operation. Circuit 320 prevents damage from these manufacturing-induced voltages as follows.

Diode 330 has a forward voltage drop Vf1 and a reverse breakdown voltage Vb1 and diode 340 has a forward voltage drop Vf2 and a reverse breakdown voltage Vb2. Diodes 330 and 340 begin to conduct when voltage Vin reaches an upper safety voltage Vus equal to the sum of voltages Vf1 and Vb2. At that point, diode 340 goes into reverse conduction and diode 330 goes into forward conduction. Any further accumulation of positive charge (i.e., increase in voltage Vin) is drained off through diodes 330 and 340. Similarly, if voltage Vin is a large negative voltage and reaches a lower safety voltage Vls equal to the negative of the sum of voltages Vb1 and Vf2, circuit 320 begins to conduct. Diode 330 goes into reverse conduction and diode 340 goes into forward conduction. Any further accumulation of negative charge (i.e., decrease in voltage Vin) is drained off through diodes 330 and 340. Therefore, the voltage across the gate dielectric of MOS device 310 is constrained to fall between voltages Vls and Vus. Diodes 330 and 340 are sized such that: a) the upper safety voltage Vus is less than an upper limit voltage Vul, at which degradation of the gate dielectric could begin to occur; and b) the lower safety voltage Vls is greater than a lower limit voltage Vll, at which degradation of the gate dielectric could also begin to occur.

Since the voltage potential at which the gate dielectric can begin to experience degradation is typically independent of whether the gate voltage is positive or negative, the magnitudes of voltages Vul and Vll are typically the same. As a result, if one of upper safety voltage Vul and lower safety voltage Vll is properly sized to provide gate dielectric protection, the other is automatically properly sized if it is equal in magnitude to the first. To simplify manufacturing requirements, it is often advantageous to configure diodes 330 and 340 to have substantially similar reverse breakdown voltages and substantially similar forward voltage drops.

Diodes 330 and 340 are also sized such that: a) voltage Vb2 is greater than the maximum positive control voltage applied to the gate of MOS device 310 during normal operation; and b) voltage Vb1 is greater than the magnitude of the maximum negative control voltage applied to the gate of MOS device 310 during normal operation. As a result, circuit 320 does not affect the actual gate voltage seen by MOS device 310 during normal IC operation. When voltage Vin is a positive control voltage, diode 340 is reverse biased. Similarly, when voltage Vin is a negative control voltage, diode 330 is reverse biased. Therefore, under normal operating conditions circuit 320 is non-conducting regardless of whether input voltage Vin is positive or negative.

For example, assume that during normal operation, MOS device 310 is coupled to receive input voltages Vin of +9V and -9V, and that any gate voltage over +12.5V (upper limit voltage Vul) will damage the gate dielectric of MOS device 310. Assume also that plasma etch steps during manufacturing can raise input voltage Vin to +15V. Finally, assume reverse breakdown voltages Vb1 and Vb2 of diodes 330 and 340, respectively, are both equal to +11.5V, and forward voltage drops Vf1 and Vf2 of diodes 330 and 340, respectively, are both equal to 0.6V.

Under these conditions, circuit 320 is always non-conducting during normal operation of MOS device 310. At an input voltage Vin of +9V, diode 340 is reverse-biased. At an input voltage Vin of -9V, diode 330 is reverse-biased. Since reverse breakdown voltages Vb1 and Vb2 are both greater than 9V, the actual gate voltages seen by MOS device 310 are unaffected by circuit 320. However, during manufacturing, if voltage Vin rises to +12.1V (upper safety voltage Vus equal to Vf1+Vb2), diode 330 goes into forward conduction and diode 340 goes into reverse conduction. As a result, any subsequent charge accumulation is drained off by circuit 320, and the voltage drop across the gate of MOS device 310 never rises above 12.1V. Note also that circuit 320 protects against a large negative charge buildup at the gate terminal of MOS device 310. If voltage Vin is a large negative voltage, when it reaches the negative of the sum of voltages Vb1 and Vf2 (lower safety voltage Vls), circuit 320 begins to conduct. Diode 340 goes into forward conduction and diode 330 goes into reverse conduction. In this manner, circuit 320 limits the magnitude of the voltage across the gate dielectric of MOS device 310 to be 12.1V or less, regardless of whether voltage Vin is positive or negative. These results are summarized in Table 2.

TABLE 2

Multi-Diode Protective Scheme Results

| Status | Vin | Desired Gate Voltage | Actual Gate Voltage |
|---|---|---|---|
| Plasma Etch: Positive Charge | +15V | <+12.5V | +12.1V |
| Plasma Etch: Negative Charge | -15V | >-12.5V | -12.1V |
| Ic Operation: Positive Input | +9V | +9V | +9V |
| Ic Operation: Negative Input | -9V | -9V | -9V |

Figure 4A:
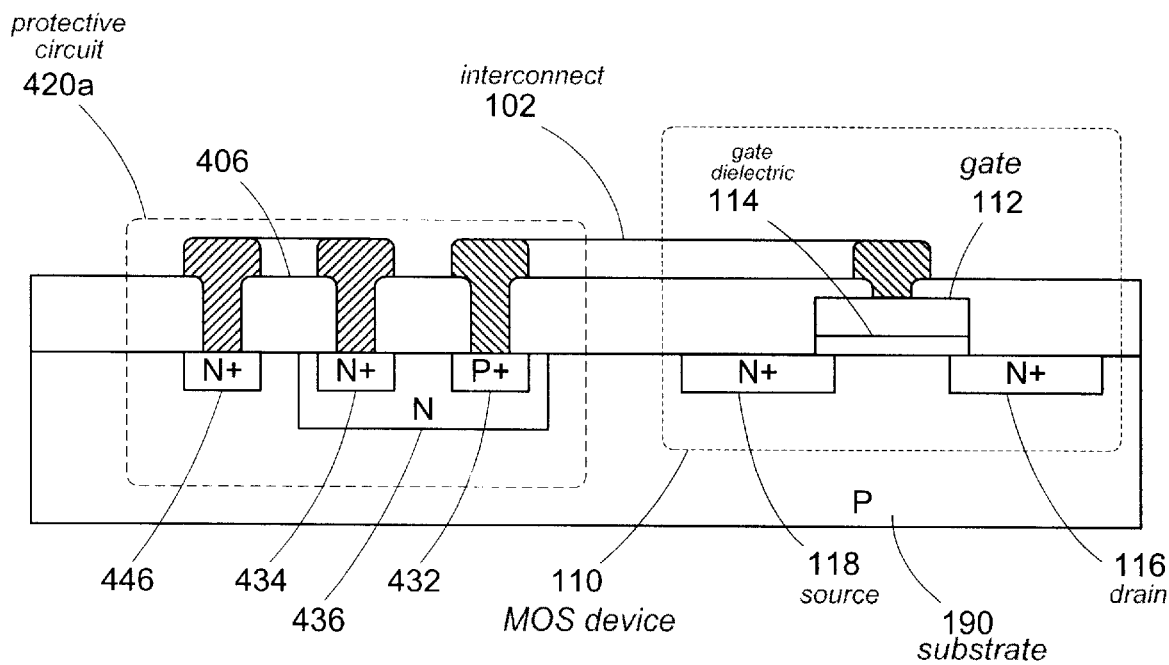
FIG. 4a is a cross sectional diagram of an implementation of the circuit of FIG. 3.

FIG. 4a shows a cross sectional diagram of a multi-diode protection circuit 420a in accordance with a particular embodiment of the present invention. Circuit 420a is equivalent to circuit 320 shown in FIG. 3. Circuit 420a comprises an n-well 436, a p+ region 432, an n+ region 434, an n+ region 446, a p-well 442, and a bridging interconnect 406. P+region 432 and n+ region 434 are both formed in n-well 436, while n+ region 446 is formed in p-well 442. Both n-well 436 and p-well 442 are formed in a p-type substrate 190. Interconnect 406 connects n+ regions 434 and 446.

The structure of circuit 420a creates two planar diodes in series. P+ region 432 and n-well 436 serve as the anode and cathode, respectively, of a first planar diode (i.e., diode 330). N+ region 446 and p-well 442 serve as the cathode and anode, respectively, of a second planar diode (i.e., diode 340). Because n+ region 446 is coupled to n+ region 434 in n-well 436, these diodes are cathode-coupled.

Figure 1:
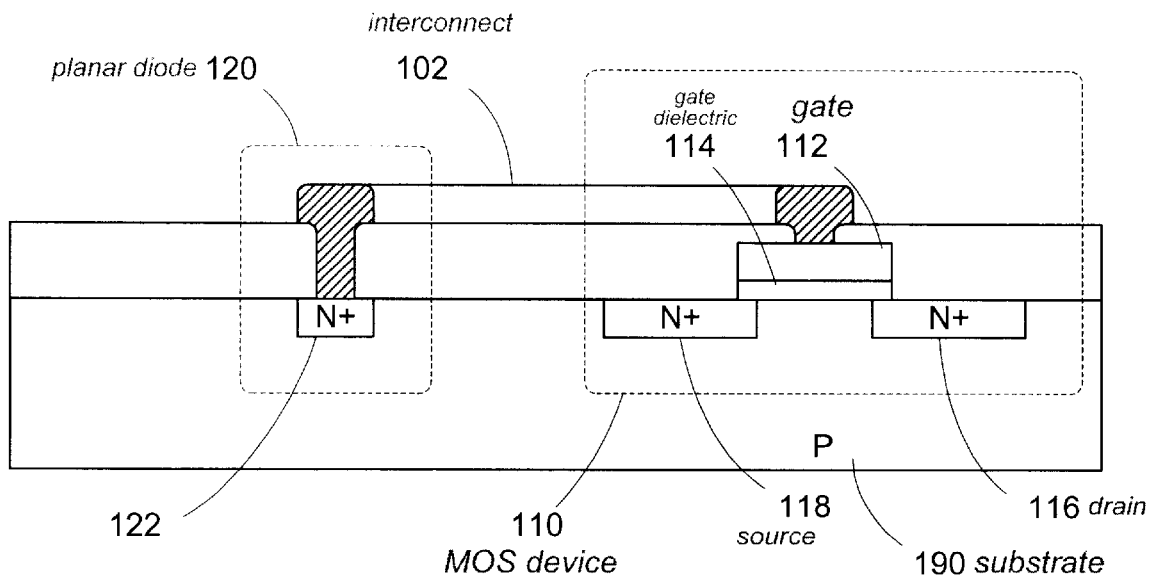
FIG. 1 is a cross sectional diagram illustrating a MOS device coupled to a conventional single-diode protection circuit.
Figure 2:
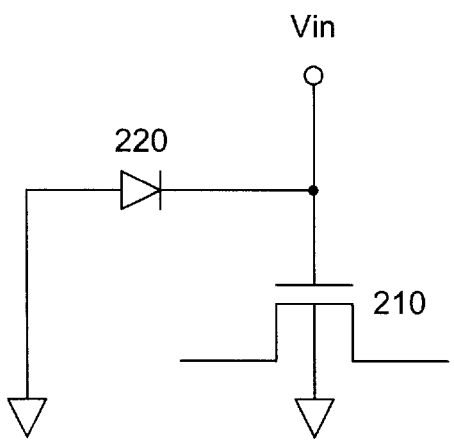
FIG. 2 is a schematic diagram illustrating the circuit of FIG. 1.

Circuit 420a is coupled to protect an n-channel MOS device 110, which was previously described in connection with FIG. 1. Alternatively, circuit 420a could be coupled to protect a p-channel MOS device formed in an n-well in substrate 110. An interconnect 102 connects p+ region 432 to gate 112. Circuit 420a is therefore connected between gate 112 and bulk ground, placing a cathode-coupled diode string in parallel with gate dielectric 114. The simple construction of circuit 420a enables it to be produced using a standard MOS process, simplifying manufacturing requirements. The diode characteristics (reverse breakdown voltages, forward voltage drops) can be adjusted somewhat by varying the dopant concentrations in n+ regions 434 and 446, in p+ region 432, in n-well 436, and in p-well 442. However, such modifications could significantly increase manufacturing complexity by requiring additional dedicated process steps, and so would generally not be desirable except in specific cases. In general, appropriate diode characteristics for circuit 420*a* should be achievable with existing manufacturing process steps.

Figure 4B:
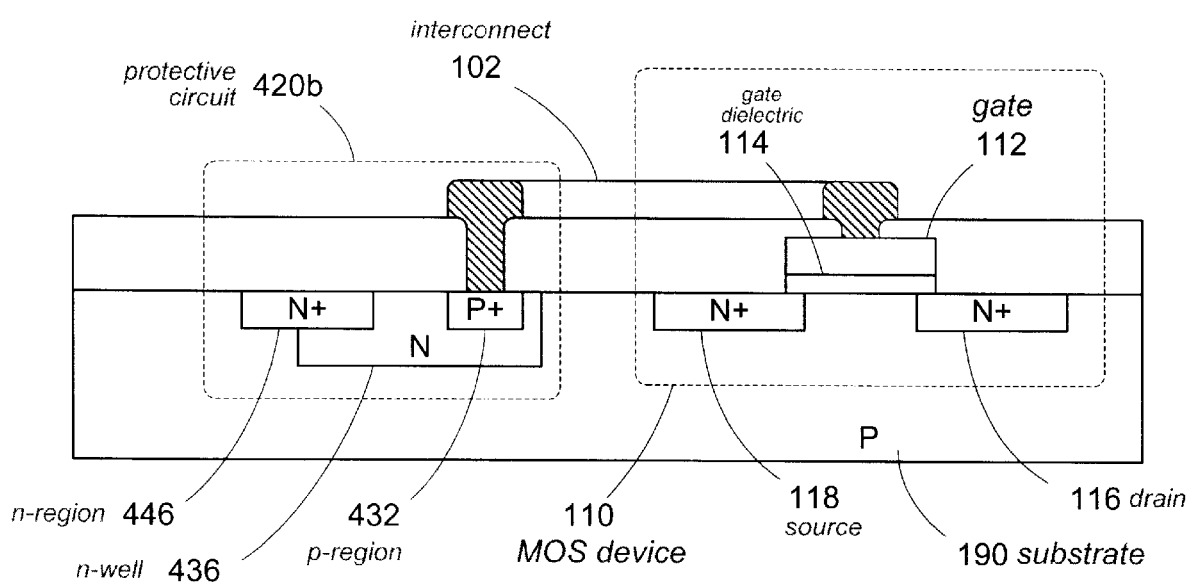
FIG. 4b is a cross sectional diagram of an implementation of the circuit of FIG. 3.

FIG. 4*b* shows a cross sectional diagram of a multi-diode protection circuit 420*b* in accordance with another embodiment of the present invention. Circuit 420*b* is equivalent to circuit 320 shown in FIG. 3. Circuit 420*b* comprises a p+ region 432, an n-well 436, an n+ region 448, and a p-well 442. P+ region 432 is formed in n-well 436, which is in turn formed in a p-type substrate 190. N+ region 448 is formed partially in n-well 436 and partially in p-well 442. Circuit 420*b* is coupled to protect an n-channel MOS device 110, previously described in connection with FIG. 1. Alternatively, circuit 420*b* could be coupled to protect a p-channel MOS device formed in an n-well in substrate 190. An interconnect 402 connects p+ region 432 with gate 112.

Circuit 420*b* performs the same function as circuit 420*a* shown in FIG. 4*a*, but in a more compact structure. By extending n+ region 448 between n-well 436 and p-well 442, the need for a bridging interconnect is eliminated. At the same time, circuit 420*b* still provides a cathode-coupled diode pair to protect the integrity of gate dielectric 114. Those diodes are created by the two p-n junctions in the current path between p+ region 432 and bulk ground; one between p+ region 432 and n-well 436, and the other between n+ region 448 and p-well 442.

Figure 5:
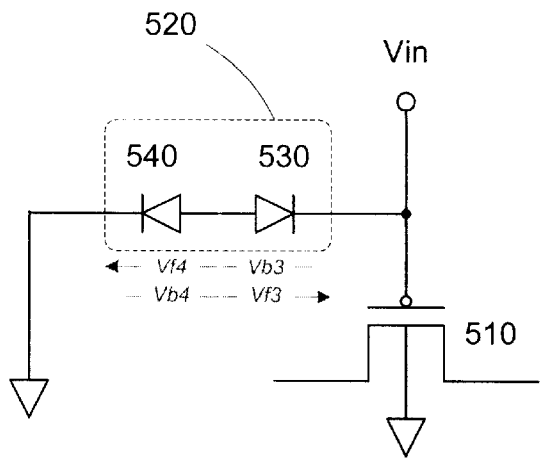
FIG. 5 is a schematic diagram illustrating a multi-diode protective circuit coupled to a MOS device.

FIG. 5 shows a schematic diagram of a circuit comprising a protection circuit 520 in accordance with another embodiment of the present invention. Circuit 520 comprises a diode 530 and a diode 540. Diodes 530 and 540 are anode-coupled and are connected between the control terminal of a p-channel MOS device 510 in an IC (not shown) and the bulk ground of the IC. The power terminals of MOS device 510 are coupled to various other devices (not shown) in the IC.

Circuit 520 functions to protect MOS device 510 in basically the same manner that circuit 320 in FIG. 3 protects MOS device 310. Diode 530 has a forward voltage drop Vf3 and a reverse breakdown voltage Vb3, and diode 540 has a forward voltage drop Vf4 and a reverse breakdown voltage Vb4. Thus, when a positive voltage Vin reaches the sum of voltages Vb3 and Vf4, both diodes 530 and 540 begin to conduct. Circuit 520 drains off any further accumulation of charge (i.e., increase in voltage Vin), limiting the voltage across the gate dielectric of MOS device 510 to a maximum value of the sum of voltages Vb3 and Vf4. Diodes 530 and 540 are sized such that the sum of voltages Vb3 and Vf4 is below any potentially damaging voltage level. Similarly, if a large negative charge accumulation develops at the gate of MOS device 510, circuit 520 limits the magnitude that negative voltage Vin to a maximum of the sum of voltages Vb4 and Vf3.

Diodes 530 and 540 are also sized such that: a) voltage Vb3 is greater than the maximum positive control voltage to be received by MOS device 510; and b) voltage Vb4 is greater than the magnitude of the maximum negative control voltage to be received by MOS device 510. As a result, circuit 520 does not affect the actual gate voltage during normal IC operation. When voltage Vin is a positive control voltage, diode 530 is reverse biased. Similarly, when voltage Vin is a negative control voltage, diode 540 is reverse biased. Circuit 520 is therefore non-conducting regardless of whether input voltage Vin is a positive or negative control voltage.

While circuit 520 does not operate in a substantially different manner than circuit 320 of FIG. 3, manufacturing considerations may sometimes make an anode-coupled diode configuration more desirable than a cathode-coupled configuration.

Figure 6:
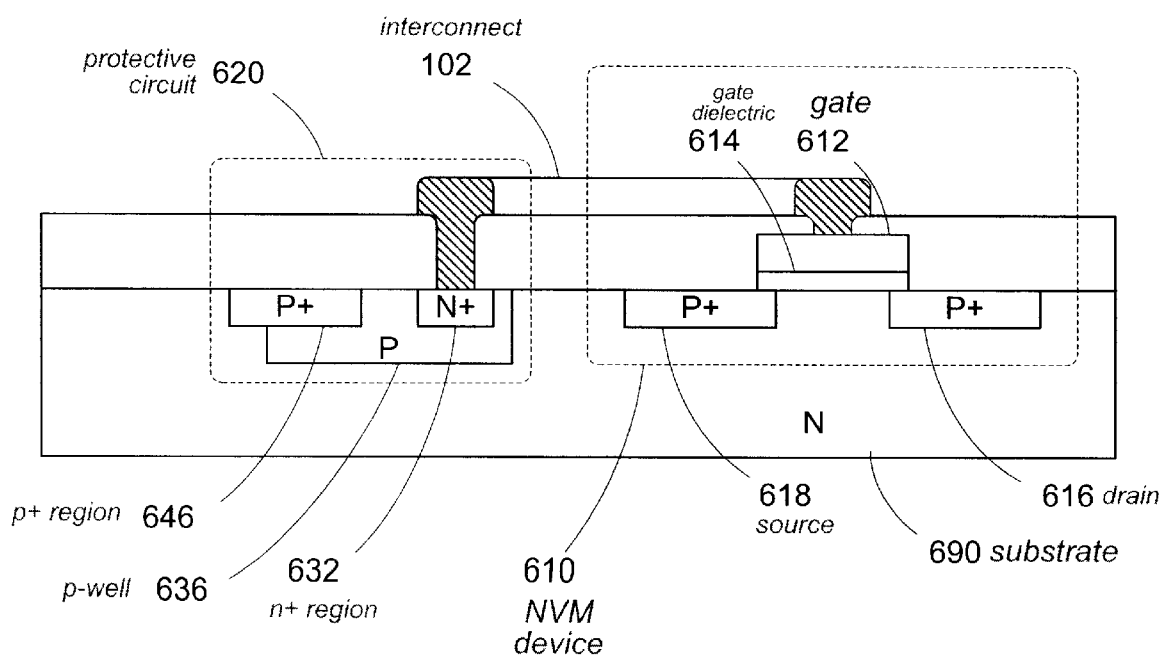
FIG. 6 is a cross sectional diagram of an implementation of the circuit of FIG. 5.

For example, FIG. 6 shows a p-channel MOS device 610 formed in an n-type substrate 690. MOS device 610 comprises a gate 612, a gate dielectric 614, a drain 616, and a source 618. Drain 616 and source 618 both comprise p+ regions formed in an n-type substrate 690. A protective circuit 620 in accordance with an embodiment of the present invention is coupled to prevent damage to gate dielectric 614 during manufacturing. Alternatively, circuit 620 could be coupled to protect an n-channel MOS device formed in a p-well in substrate 690. Circuit 620 comprises an n+ region 632, a p-well 636, a p+ region 646, and an n-well 642. N+ region 632 is formed in p-well 636, which is in turn formed in n-type substrate 690. P+ region 646 is formed partially in p-well 636 and partially in n-well 642.

Circuit 620 forms a pair of anode-coupled diodes, and is therefore equivalent to circuit 520 shown in FIG. 5. The p-n junction between n+ region 632 and p-well 636 forms the first diode and the p-n junction between p+ region 646 and n-well 642 forms the second diode. Because MOS device 610 is formed in an n-type substrate (substrate 690), creation of a cathode-coupled diode string would require a more complicated structure, including at least an additional interconnect. Therefore, the anode-coupled diode string structure of circuit 620 would be preferable for an n-type substrate.

Although the present invention has been described in connection with several embodiments, it is understood that this invention is not limited to the embodiments disclosed, but is capable of various modifications which would be apparent to one of ordinary skill in the art. For example, in circuit 420*b* of FIG. 4*b*, n-well 436 could be replaced by a deep n+ region, thereby eliminating the need for both n-well 436 and n+ region 446. Note that any additional processes required for such variations (in the example given, a high-energy implant step to form the deep n+ region) could undesirably raise manufacturing complexity and cost. However, depending on the specific available processes, numerous such variations are possible. Thus, the invention is limited only by the following claims.

I claim:

1. An insulated-gate semiconductor device comprising:

a control terminal;

a body terminal;

a gate dielectric;

a first p-n junction diode coupled to the control terminal; and a second p-n junction diode coupled between the first p-n junction diode and the body terminal, the first p-n junction diode being configured to be reverse-biased when a first polarity exists between the control terminal and the body terminal, and the second p-n junction diode being configured to be reverse-biased when a second polarity exists between the control terminal and the body terminal, the second polarity being opposite in polarity to the first polarity.

2. The insulated-gate semiconductor device of claim 1, the first p-n junction diode and the second p-n junction diode being anode-coupled.

3. The insulated-gate semiconductor device of claim 1, the first p-n junction diode and the second p-n junction diode being cathode-coupled.

4. The insulated-gate semiconductor device of claim 2, wherein the gate dielectric is subject to damage when exposed to an upper limit voltage, the first p-n junction diode being sized to have a first reverse breakdown voltage less than the upper limit voltage.

5. The insulated-gate semiconductor device of claim 4, wherein the gate dielectric is subject to damage when exposed to a lower limit voltage, the second p-n junction diode being sized to have a second reverse breakdown voltage less than the magnitude of the lower limit voltage.

6. The insulated-gate semiconductor device of claim 5, the first reverse breakdown voltage being greater than a maximum normal operating voltage applied to the control terminal.

7. The insulated-gate semiconductor device of claim 6, the second reverse breakdown voltage being less than the magnitude of a minimum normal operating voltage applied to the control terminal.

8. The insulated-gate semiconductor device of claim 3, wherein:

the body terminal comprises a p-type substrate;

the first p-n junction diode comprises a p+ region formed in an n-well; and the second p-n junction diode comprises a first n+ region formed in a p-well.

9. The insulated-gate semiconductor device of claim 8 further comprising:

a second n+ region formed in the n-well; and an interconnect connecting the first n+ region and the second n+ region.

10. The insulated-gate semiconductor device of claim 8 wherein the first n+ region extends into the n-well.

11. The insulated-gate semiconductor device of claim 2 wherein:

the body terminal comprises a n-type substrate;

the first p-n junction diode comprises an n+ region formed in a p-well; and the second p-n junction diode comprises a p+ region formed in an n-well.

12. The insulated-gate semiconductor device of claim 10 wherein the p+ region extends into the p-well.

13. In an insulated gate semiconductor device having a control terminal, a gate dielectric, and a body terminal, a circuit for protecting the gate dielectric comprising:

a first p-n junction diode coupled to the control terminal of the MOS device; and a second p-n junction diode coupled between the first p-n junction diode and the body terminal of the MOS device, the polarity of the second p-n junction diode being opposite that of the first p-n junction diode.

14. The circuit of claim 13 wherein:

the first p-n junction diode comprises an first anode coupled to the control terminal, and a first cathode; and the second p-n junction diode comprises a second cathode coupled to the first cathode, and a second anode coupled to the body terminal.

15. The circuit of claim 13 wherein:

the first p-n junction diode comprises a first cathode coupled to the control terminal, and a first anode; and the second p-n junction diode comprises a second anode coupled to the first anode, and a second cathode coupled to the body terminal.

16. The circuit of claim 13 wherein:

the reverse breakdown voltage of the first p-n junction diode is substantially equal to the reverse breakdown voltage of the second p-n junction diode; and the forward voltage drop of the first p-n junction diode is substantially equal to the forward voltage drop of the second p-n junction diode.

17. A method for protecting a gate dielectric of an insulated gate semiconductor device having a control terminal coupled to receive an input voltage, the method comprising the steps of:

applying the input voltage to the control terminal;

draining positive charge from the control terminal through a reverse-biased p-n junction diode and then a forward-biased p-n junction diode when the input voltage is greater than an upper safety voltage; and draining negative charge from the control terminal through a forward-biased p-n junction diode and a then reverse-biased p-n junction diode when the input voltage is negative and the magnitude of the input voltage is greater than a lower safety voltage.

18. The method of claim 17 wherein:

the upper safety voltage is equal to the sum of the reverse breakdown voltage of a first p-n junction diode and the forward voltage drop of a second p-n junction diode; and the lower safety voltage is equal to the sum of the forward voltage drop of the first p-n junction diode and the reverse breakdown voltage of the second p-n junction diode.

* * * * *